(12) United States Patent
Arakawa

(10) Patent No.: US 7,034,918 B2
(45) Date of Patent: Apr. 25, 2006

(54) EXPOSURE APPARATUS, MAINTENANCE METHOD THEREFOR, SEMICONDUCTOR DEVICE MANUFACTURING METHOD USING THE APPARATUS, AND SEMICONDUCTOR MANUFACTURING FACTORY

(75) Inventor: Kiyoshi Arakawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/083,936

(22) Filed: Mar. 21, 2005

(65) Prior Publication Data

US 2005/0146696 A1 Jul. 7, 2005

Related U.S. Application Data

(63) Continuation of application No. 10/622,143, filed on Jul. 18, 2003, now Pat. No. 6,891,593, which is a continuation of application No. 09/986,918, filed on Nov. 13, 2001, now Pat. No. 6,757,048.

(30) Foreign Application Priority Data

Nov. 15, 2000 (JP) ............................. 2000-348713

(51) Int. Cl.
G03B 27/52 (2006.01)
G03B 27/42 (2006.01)

(52) U.S. Cl. .......................................... 355/30; 355/53
(58) Field of Classification Search ................ 355/30, 355/53, 67, 72–75; 310/10, 12; 378/34
See application file for complete search history.

(56) References Cited

U.S. PATENT DOCUMENTS

| 4,676,614 A | * | 6/1987 | Ohno | ......................... | 353/101 |
| 4,766,309 A | | 8/1988 | Kudo | ...................... | 250/237 R |
| 5,243,377 A | | 9/1993 | Umatate et al. | ............... | 355/53 |
| 5,305,364 A | | 4/1994 | Mochiji et al. | ................ | 378/34 |
| 5,559,584 A | | 9/1996 | Miyaji et al. | .................. | 355/73 |
| 6,207,962 B1 | | 3/2001 | Okino | ...................... | 250/492.2 |
| 6,253,464 B1 | | 7/2001 | Klebanoff et al. | ............. | 34/403 |
| 6,341,006 B1 | | 1/2002 | Murayama et al. | ............ | 355/53 |
| 6,362,489 B1 | | 3/2002 | Okino | ...................... | 250/491.1 |
| 6,542,220 B1 | * | 4/2003 | Schrijver et al. | .............. | 355/53 |
| 2001/0052578 A1 | | 12/2001 | Okino | ...................... | 250/492.3 |

FOREIGN PATENT DOCUMENTS

| EP | 1 030 351 A1 | 8/2000 |
| EP | 1 075 017 A1 | 2/2001 |
| EP | 1 098 225 A2 | 5/2001 |
| JP | 6-260385 | 9/1994 |

(Continued)

OTHER PUBLICATIONS

Okabe, Hideo. "Photochemistry of Small Molecules," *A Wiley-Interscience Publication*, 1978, p. 177-179.

(Continued)

*Primary Examiner*—Henry Hung Nguyen
(74) *Attorney, Agent, or Firm*—Fitzpatrick, Cella, Harper & Scinto

(57) ABSTRACT

An exposure apparatus includes a reticle stage which holds a reticle, a projection optical system which projects a pattern of the reticle onto a substrate, a reticle surface plate which is a base plate disposed between the reticle and the projection optical system and which supports the reticle stage. The reticle surface plate has an opening for transmitting exposure light. The exposure apparatus further includes a sheet glass set on the reticle surface plate so as to separate a space inside the opening of the reticle surface plate from a space above the reticle surface plate.

6 Claims, 19 Drawing Sheets

FOREIGN PATENT DOCUMENTS

| | | |
|---|---|---|
| JP | 6-275489 | 9/1994 |
| JP | 7-263296 | 10/1995 |
| JP | 8-279458 | 10/1996 |
| JP | 8-279459 | 10/1996 |
| JP | 9-82625 | 3/1997 |
| JP | 11-219902 | 8/1999 |
| JP | 2000-58447 | 2/2000 |
| JP | 2000-179590 | 6/2000 |
| JP | 2000-195779 | 7/2000 |
| JP | 2001-210587 | 8/2001 |
| WO | WO 99/50892 | 10/1999 |

OTHER PUBLICATIONS

Korean Office Action dated Sep. 17, 2003, issued in corresponding Korean patent application No. 10-2001-0070791.
Partial European Search Report dated Jan. 28, 2005, issued in corresponding European patent application No. EP 01 03 9576, forwarded in a Communication dated Feb. 14, 2005.
Taiwanese Office Action dated Sep. 9, 2005, issued in corresponding Taiwanese patent application No. 090127683.

* cited by examiner

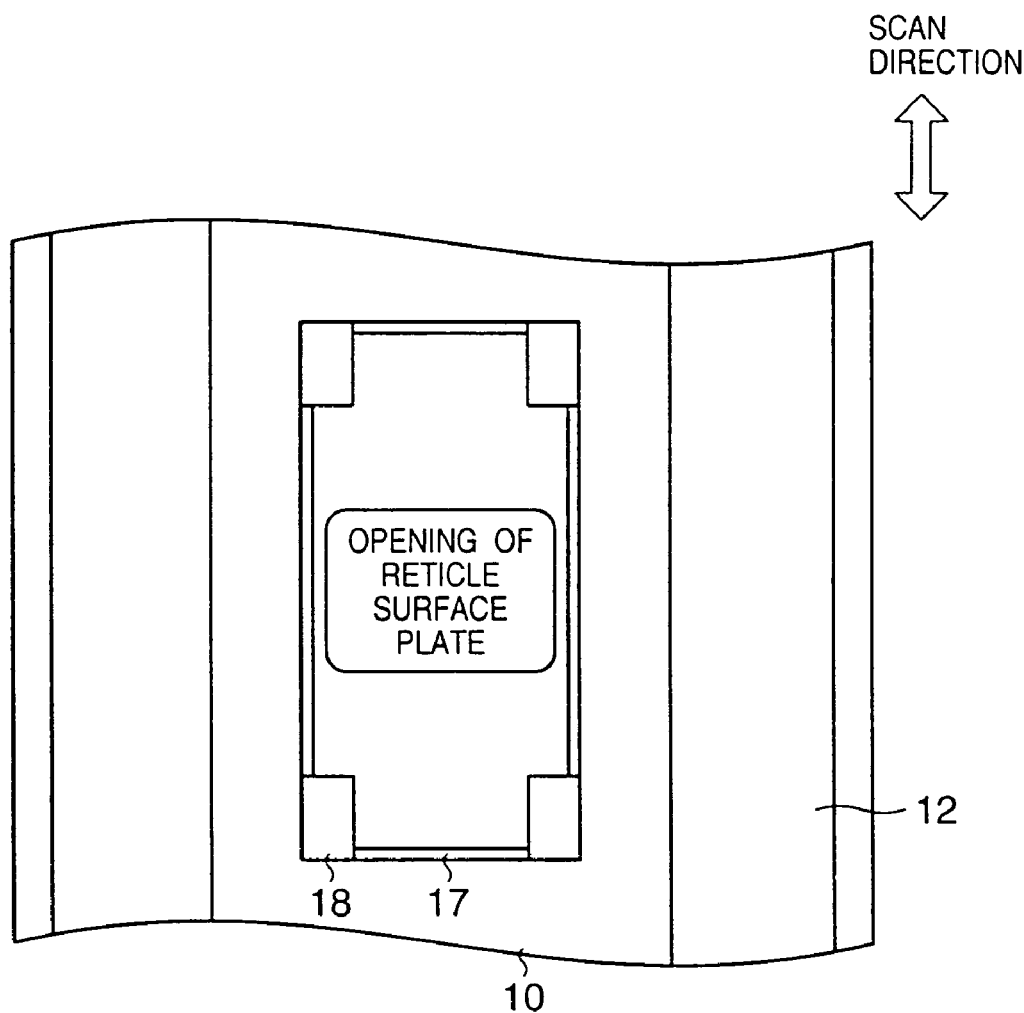

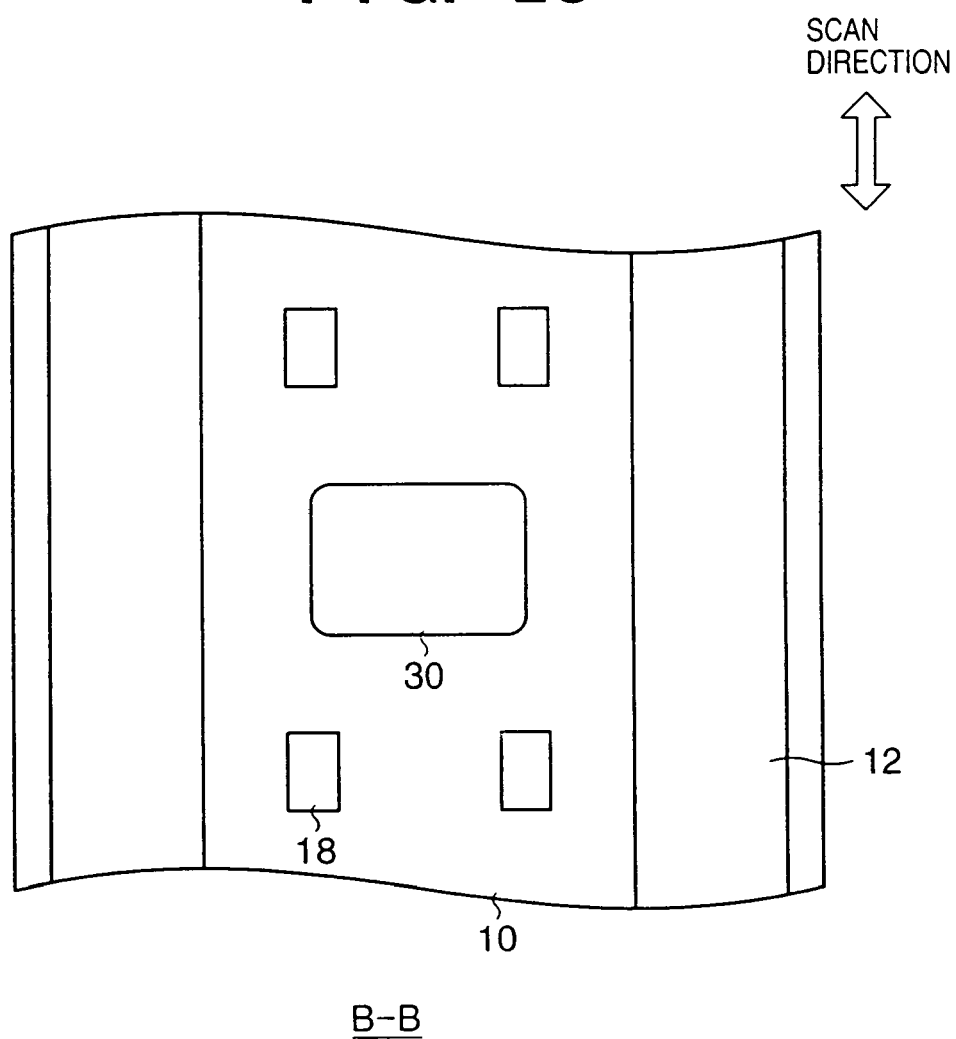

B-B

C-C

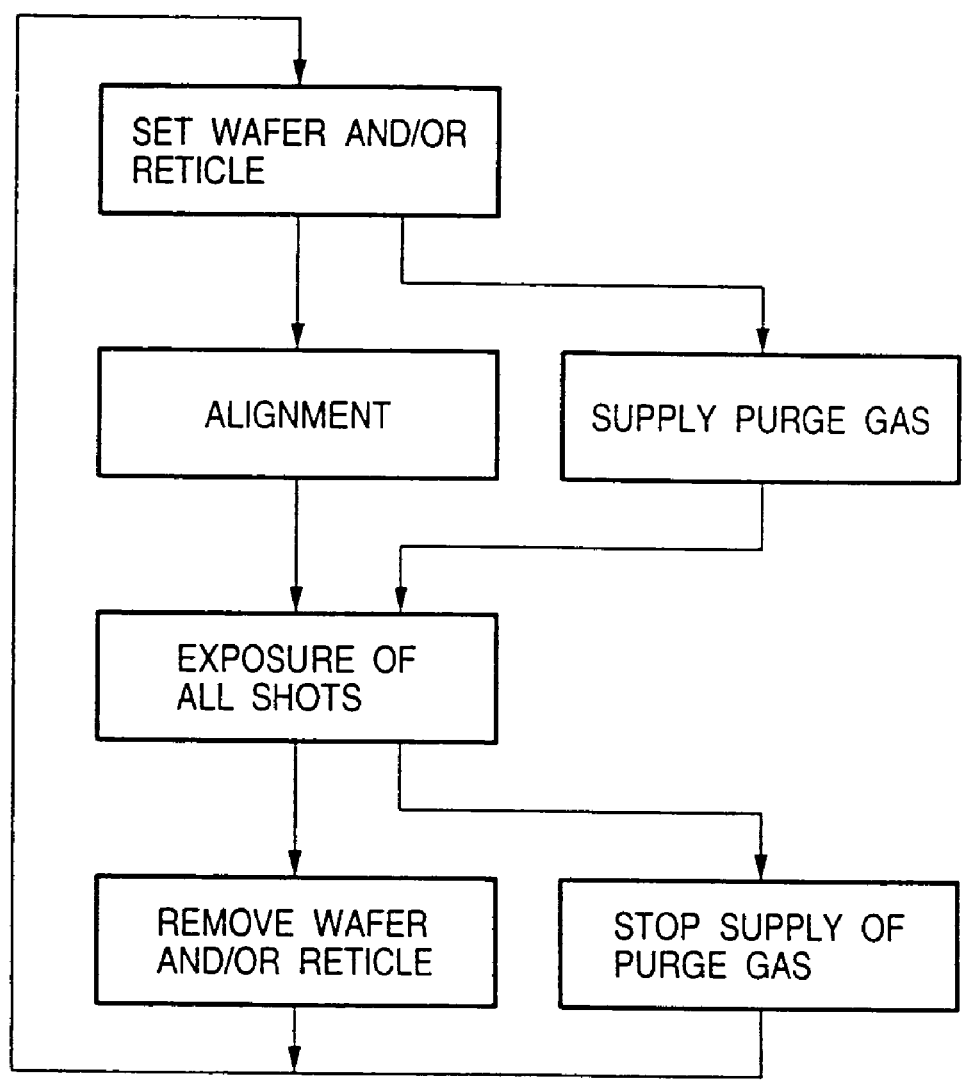

SEMICONDUCTOR DEVICE MANUFACTURING FLOW

EXPOSURE APPARATUS, MAINTENANCE METHOD THEREFOR, SEMICONDUCTOR DEVICE MANUFACTURING METHOD USING THE APPARATUS, AND SEMICONDUCTOR MANUFACTURING FACTORY

This application is a continuation of application Ser. No. 10/622,143 filed Jul. 18, 2003, now U.S. Pat. No. 6,891,593 which is a continuation of application Ser. No. 09/986,918 filed Nov. 13, 2001, U.S. Pat. No. 6,757,048 B2.

FIELD OF THE INVENTION

The present invention relates to an exposure apparatus for projecting a mask pattern onto a photosensitive substrate via a projection optical system, a maintenance method for the apparatus, a semiconductor device manufacturing method using the apparatus, and a semiconductor manufacturing factory.

BACKGROUND OF THE INVENTION

A conventional manufacturing process for manufacturing a semiconductor element such as an LSI or VLSI formed from a micropattern uses a reduction type projection exposure apparatus for transferring by reduction projection a circuit pattern drawn on a mask such as a reticle onto a substrate coated with a photosensitive agent. With an increase in the packaging density of semiconductor elements, demands have arisen for further micropatterning. Exposure apparatuses are coping with micropatterning along with the development of a resist process.

Methods of increasing the resolving power of the exposure apparatus include a method of changing the exposure wavelength to a shorter one, and a method of increasing the numerical aperture (NA) of the projection optical system.

As for the exposure wavelength, a KrF excimer laser with an oscillation wavelength of 365-nm i-line to recently 248 nm, and an ArF excimer laser with an oscillation wavelength around 193 nm have been developed. A fluorine ($F_2$) excimer laser with an oscillation wavelength around 157 nm is also under development.

An ArF excimer laser with a wavelength around ultraviolet rays, particularly, 193 nm, and a fluorine ($F_2$) excimer laser with an oscillation wavelength around 157 nm are known to have an oxygen ($O_2$) absorption band around their wavelength band.

For example, a fluorine excimer laser has been applied to an exposure apparatus because of a short wavelength of 157 nm. The 157-nm wavelength falls within a wavelength region called a vacuum ultraviolet region. Light in this wavelength region is greatly absorbed by oxygen molecules. In other words, light hardly passes through the air. Thus, the fluorine excimer laser can only be applied in a low-oxygen-concentration environment. According to the reference "Photochemistry of Small Molecules" (Hideo Okabe, A Wiley-Interscience Publication, 1978, p. 178), the absorption coefficient of oxygen to 157-nm light is about 190 atm$^{-1}$ cm$^{-1}$. This means when 157-nm light passes through a gas at an oxygen concentration of 1% at one atmospheric pressure, the transmittance per cm is only $$T=\exp(-190\times1 \text{ cm}\times0.01 \text{ atm})=0.150.$$

In such an exposure apparatus using an ArF excimer laser with a wavelength around ultraviolet rays, particularly, 193 nm, or a fluorine ($F_2$) excimer laser with a wavelength around 157 nm, an ArF excimer laser beam or fluorine ($F_2$) excimer laser beam is readily absorbed by a substance. A light absorption substance in the optical path must be purged to several ppm order or less. This also applied to moisture, which must be removed to the ppm order or less.

To ensure the transmittance and stability of ultraviolet rays, the ultraviolet path of a reticle stage or the like in the exposure apparatus is purged with inert gas. For example, Japanese Patent Laid-Open No. 6-260385 discloses a method of spraying inert gas to a photosensitive substrate, which is not enough to purge oxygen or moisture. Japanese Patent Laid-Open No. 8-279458 discloses a method of covering the whole space from the lower end of a projection optical system to the vicinity of a photosensitive substrate with a sealing member. However, the stage is difficult to move, and this method is not practical. Japanese Patent Application No. 2000-179590 discloses a method of disposing a cover for covering the ultraviolet path from the reticle-side lower end of an illumination optical system to the vicinity of a reticle stage, and spraying inert gas into the cover. However, oxygen or moisture cannot be sufficiently purged because the space from a reticle holder for holding a reticle to a reticle surface plate for supporting a reticle stage is not surrounded. In addition, a sheet glass is set on the reticle stage side serving as a movable portion, which increases the weight of the reticle stage. Since the scan stroke range of the reticle stage must be covered with the sheet glass, a large sheet glass is required to further increase the weight. The sheet glass deforms by driving of the reticle stage, changing the optical characteristics. Particularly when the sheet glass functions as an optical element, changes in optical characteristics typically appear. In this case, the optical characteristics must be uniform within the scan stroke range, resulting in a very complicated process. Connection of an inert gas supply tube to the reticle stage side serving as a movable portion transmits vibrations from the tube. Scan operation while the tube is connected degrades the control characteristics of the reticle stage.

As described above, an exposure apparatus using an ultraviolet ray, particularly, an ArF excimer laser beam or fluorine ($F_2$) excimer laser beam suffers from large absorption of light of this wavelength by oxygen and moisture. To obtain a sufficient transmittance and stability of an ultraviolet ray, the oxygen and moisture concentrations in the optical path must be reduced.

From this, demands have arisen for the development of an effective purge system for the ultraviolet light path in the exposure apparatus, particularly for the vicinity of a wafer and reticle which are often loaded/unloaded into/from the exposure apparatus.

SUMMARY OF THE INVENTION

The present invention has been made to overcome the conventional drawbacks, and has as its object to provide a device for effectively purging, e.g., part of the optical path with inert gas in an exposure apparatus for projecting a reticle pattern onto a photosensitive substrate via a projection optical system, a semiconductor device manufacturing method using the apparatus, a manufacturing factory, and a maintenance method therefor.

According to the first aspect of the present invention, the foregoing object is attained by providing an exposure apparatus comprising a reticle stage which holds a reticle, a reticle surface plate which supports the reticle stage, a projection optical system which projects a pattern of the reticle onto a substrate, a shield which surrounds a space between the reticle stage and the reticle surface plate through which exposure light passes and shields the space from outside, and a gas supply which supplies inert gas into the space shielded by the shield.

In the preferred embodiment, the shield is supported by the reticle stage. The shield is preferably arranged to allow movement of the reticle stage on the reticle surface plate. The shield can be formed from a plate member. The shield can include an air curtain or a hydrostatic bearing disposed between the reticle stage and the reticle surface plate.

In the preferred embodiment, the inert gas supplied to the hydrostatic bearing is also supplied to the space shielded by the shield to purge the space.

It is preferable that the apparatus mentioned above further comprises a sheet glass set on the reticle surface plate so as to separate, from the space shielded by the shield, a space inside an opening which is formed in the reticle surface plate to transmit exposure light.

It is preferable that the apparatus mentioned above further comprises a second gas supply which supplies inert gas to the space separated by the sheet glass.

It is preferable that the apparatus mentioned above further comprises a gas recovery which recovers gas from the space shielded by the shield.

It is preferable that the apparatus mentioned above further comprises a sensor arranged to measure a pressure in the space shielded by the shield and a controller arranged to control the gas supply on the basis of the pressure measured by the sensor.

It is preferable that the apparatus mentioned above further comprises a cleaning gas supply which supplies cleaning gas into the space shielded by the shield. The cleaning gas can include at least one of oxygen and ozone.

The apparatus can further comprise an illumination optical system and an enclosure which surrounds a space between the illumination optical system and the reticle stage through which exposure light passes. It is preferable that the enclosure is arranged such that a gap is provided between a lower end thereof and the reticle stage, and the reticle stage has, around the reticle, a top plate with a surface flush with an upper surface of the reticle.

The apparatus can further comprise a substrate stage which holds the substrate and an enclosure which surrounds a space between the projection optical system and the substrate stage through which exposure light passes. It is preferable that the enclosure is arranged such that a gap is provided between a lower end thereof and the substrate stage, and the substrate stage has, around the substrate, a top plate with a surface flush with an upper surface of the substrate.

In the preferred embodiment, the shield is so arranged as to prevent an opening of the reticle surface plate from deviating from a region defined by the shield.

According to the second aspect of the present invention, the foregoing object is attained by providing an exposure apparatus comprising a reticle stage which holds a reticle, a reticle surface plate which supports the reticle stage, the reticle surface plate having an opening for transmitting exposure light, a projection optical system which projects a pattern of the reticle onto a substrate, and a sheet glass set on the reticle surface plate so as to separate a space inside the opening of the reticle surface plate from a space above the reticle surface plate.

According to the third aspect of the present invention, the foregoing object is attained by providing an exposure apparatus comprising an optical system, a stage which moves with a flat object during exposure, and an enclosure which surrounds a space between the optical system and the stage through which exposure light passes. The enclosure is arranged such that a gap is provided between a lower end thereof and the stage, and the stage has, around the flat object, a top plate with a surface flush with an upper surface of the flat object.

The optical system may be an illumination optical system, and the stage may be a reticle stage. Alternatively, the optical system may be a projection optical system, and the stage may be a substrate stage.

According to the fourth aspect of the present invention, the foregoing object is attained by providing a device manufacturing method comprising the steps of installing, in a semiconductor manufacturing factory, manufacturing apparatuses, for performing various processes, including the above exposure apparatus, and manufacturing a semiconductor device by performing a plurality of processes using the manufacturing apparatuses.

It is preferable that the method mentioned above further comprises the steps of connecting the manufacturing apparatuses via a local area network and communicating information about at least one of the manufacturing apparatuses between the local area network and an external network outside the semiconductor manufacturing factory.

It is preferable that the method mentioned above further comprises the step of accessing a database provided by a vendor or user of the exposure apparatus via the external network, thereby obtaining maintenance information of the exposure apparatus by data communication.

It is preferable that the method mentioned above further comprises the step of performing data communication between the semiconductor manufacturing factory and another semiconductor manufacturing factory via the external network, thereby performing production management.

According to the fifth aspect of the present invention, the foregoing object is attained by providing a semiconductor manufacturing factory comprising: manufacturing apparatuses, for performing various processes, including the above exposure apparatus; a local area network for connecting the manufacturing apparatuses; and a gateway for allowing access to an external network outside the factory from the local area network, wherein information about at least one of the manufacturing apparatuses is communicated.

According to the sixth aspect of the present invention, the foregoing object is attained by providing a maintenance method for the above exposure apparatus that is installed in a semiconductor manufacturing factory, comprising the steps of: making a vendor or user of the exposure apparatus provide a maintenance database connected to an external network outside the semiconductor manufacturing factory; allowing access to the maintenance database from the semiconductor manufacturing factory via the external network; and transmitting maintenance information accumulated in the maintenance database to the semiconductor manufacturing factory via the external network.

It is preferable that the apparatus further comprises a display, a network interface and a computer for executing network software, and the display, the network interface, and the computer enable communicating maintenance information of the exposure apparatus via a computer network.

In the preferred embodiment, the network software provides on the display the user interface for accessing a maintenance database provided by a vendor or user of the exposure apparatus and connected to the external network outside a factory in which the exposure apparatus is installed, and information is obtained from the database via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1C is a sectional view taken along the line C—C in FIG. 1A;

FIG. 2C is a sectional view taken along the line C—C in FIG. 2A;

FIG. 5 is a flow chart showing projection exposure operation according to the fifth embodiment of the present invention;

DETAILED DESCRIPTION OF THE PREFERRED EMBODIMENTS

An exposure apparatus according to the present invention is not limited except for arrangements defined by the appended claims.

Ultraviolet rays as exposure light used in the exposure apparatus of the present invention are not specifically limited. A purge system according to the present invention is particularly effective for an ArF excimer laser with a wavelength around far ultraviolet rays, particularly, 193 nm, and a fluorine ($F_2$) excimer laser with a wavelength around 157 nm, as described above.

Preferred embodiments of the present invention will be described below with reference to the accompanying drawings.

<First Embodiment>

Figure 1A:
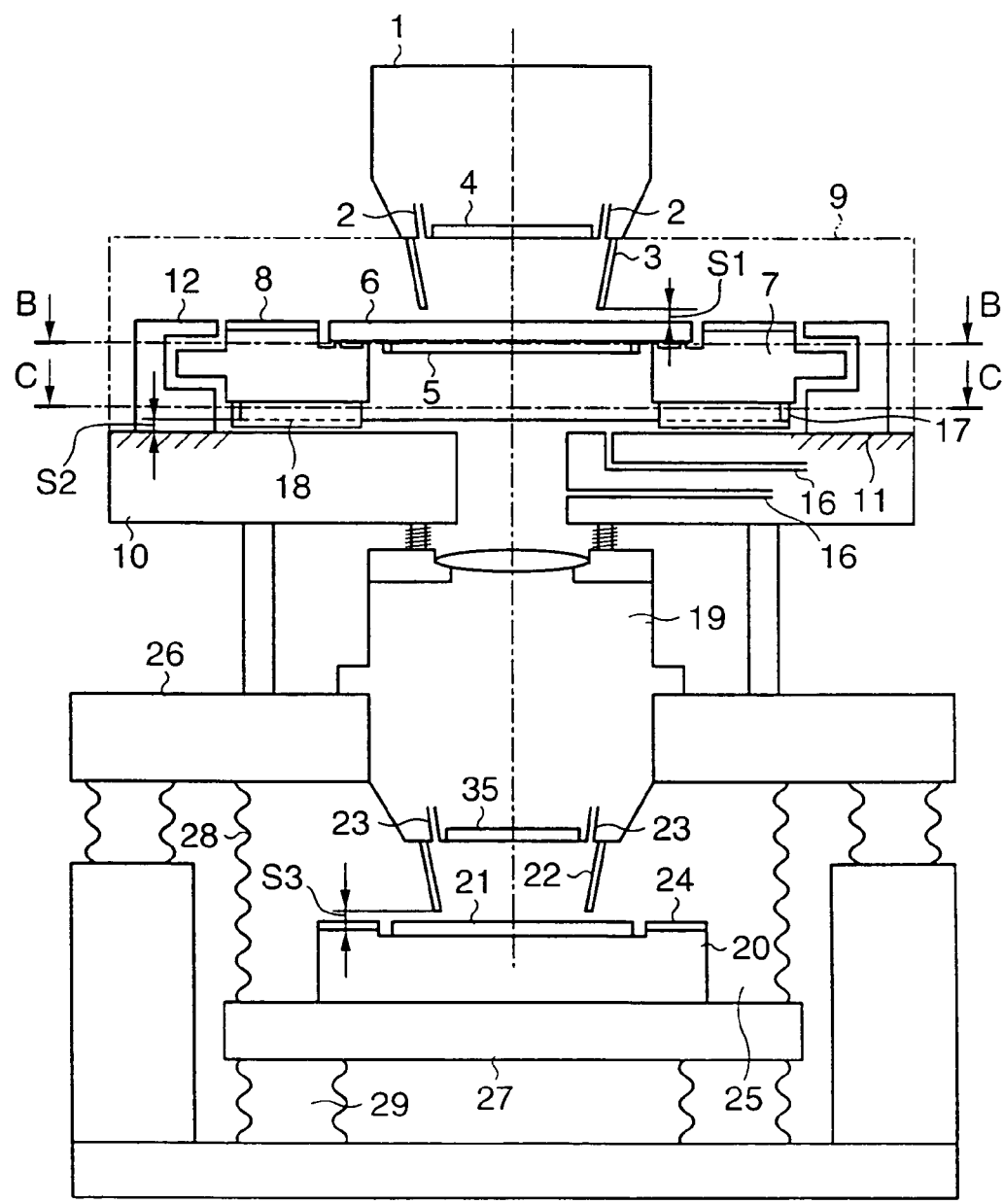
FIG. 1A is a schematic view showing a projection exposure apparatus according to the first embodiment of the present invention.
Figure 1B:
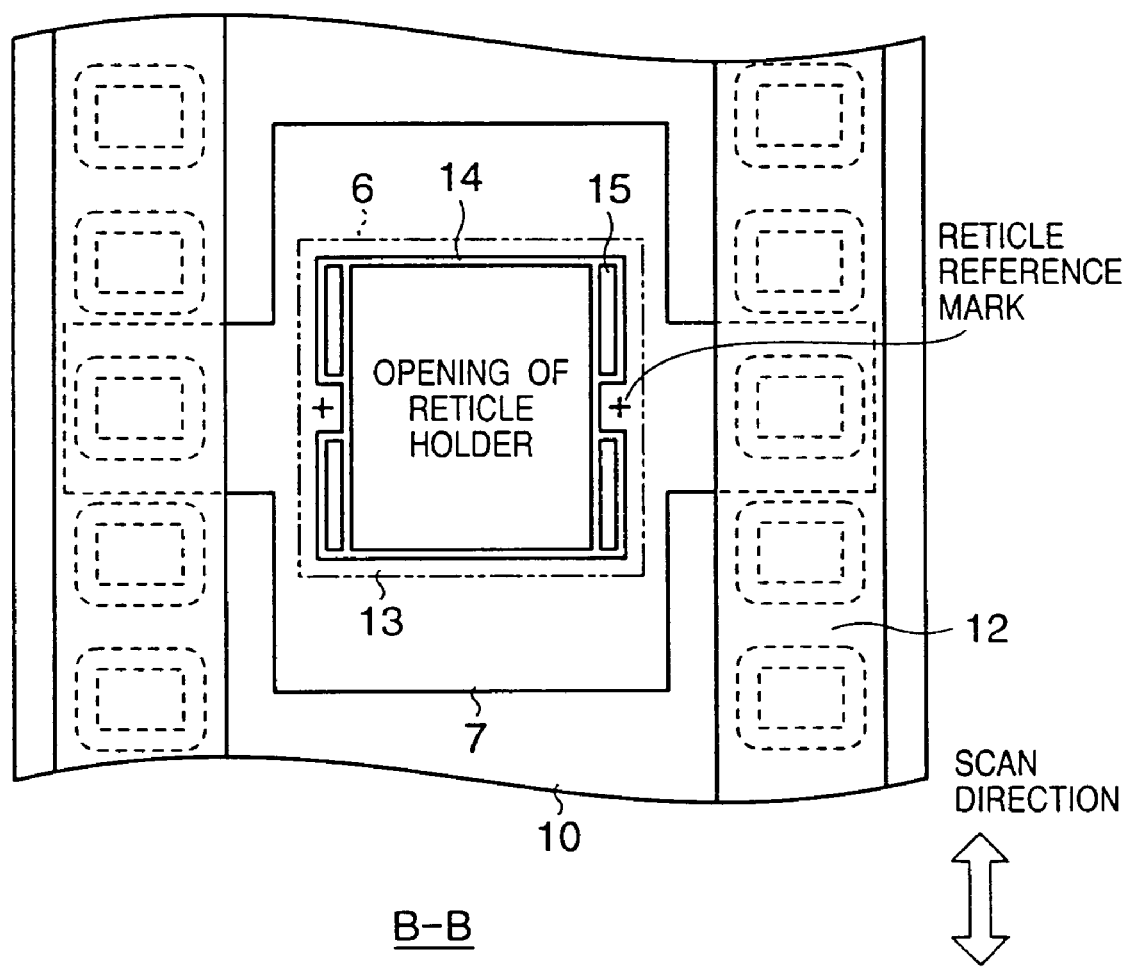
FIG. 1B is a sectional view taken along the line B—B in FIG. 1A.

FIG. 1A shows the main part of a step & scan type projection exposure apparatus according to the first embodiment of the present invention. FIGS. 1B and 1C are sectional views of the exposure apparatus in FIG. 1A taken along the lines B—B and C—C, respectively. In FIGS. 1A to 1C, ultraviolet rays which have reached an illumination optical system 1 in the exposure apparatus from an ultraviolet source (not shown) irradiate a reticle 6 held by a reticle holder 13 on a reticle stage 7. A cover 3 serving as an enclosure for surrounding the ultraviolet path and shielding it from the surroundings extends from the reticle-side lower end of the illumination optical system 1 toward the vicinity of the reticle stage 7. Supply portions (including, e.g., a flow path and nozzle) 2 for supplying purge gas made of inert gas into the cover 3 are formed. The gap between the lower end of the cover 3 and the reticle 6 is S1. Inert gas such as nitrogen, helium, or argon is supplied from the illumination optical system 1 into the cover 3 via the gas supply portions 2 to purge an exposure obstacle such as oxygen or moisture.

A top plate 8 is mounted on the reticle stage 7 so as to be flush with the upper surface of the reticle 6. This prevents the reticle stage 7 from shifting from a portion effectively purged by the cover 3 even if the reticle stage 7 moves by a scan operation. The impurity inside the cover 3 can be satisfactorily removed. It is more desirable to surround a purge area 9 outside the cover 3 with another cover or the like, purge the purge area 9, and remove the impurity to a given degree. With this arrangement, the impurity inside the cover 3 can be removed to a lower concentration. An example of the purge area 9 can be a space defined by a chain double-dashed line.

A linear motor stator 12 is attached to a reticle stage traveling surface 11 on a reticle surface plate 10 for supporting the reticle stage 7. The reticle stage 7 moves while being guided by the linear motor stator 12. A chuck groove 15 is formed in the periphery of a reticle chuck surface 14 of the reticle holder 13 on the reticle stage 7. The reticle 6 is set on the reticle chuck surface 14 while the entire periphery of the reticle 6 is in contact with the reticle chuck surface 14 (note that no problem occurs even if part of the reticle chuck surface 14 is notched and part of the reticle 6 is not in contact with the reticle chuck surface 14 as far as the gap is small). The inside of the reticle chuck surface 14 of the reticle holder 13 and the center of the reticle stage 7 are opened as a space so as to transmit an exposure light beam. The center of the reticle surface plate 10 is also opened to transmit an exposure light beam. The reticle surface plate 10 has gas supply portions 16 for supplying purge gas made of inert gas.

An enclosure 17 serving as a shield for schematically shielding the opening of the reticle stage and the opening of the reticle surface plate from the surroundings is attached to the reticle surface plate side of the opening of the reticle stage. The gap between the lower end of the enclosure 17 and the reticle surface plate 10 is S2. The enclosure 17 is so arranged as to prevent the opening of the reticle surface plate from deviating from the internal region defined by the enclosure 17 during scan exposure.

As a conceivable example of the enclosure 17, the opening of the reticle stage 7 is surrounded by a cover (e.g., plate member) attached to the reticle stage 7, the opening of the reticle stage 7 is surrounded by a hydrostatic bearing 18 for guiding the reticle stage 7, or the opening of the reticle stage 7 is surrounded by a cover and one or more hydrostatic bearings 18 (FIG. 1C). A preferable cover is one made of a metal such as stainless steel or one made of a resin such as fluoroplastics. The enclosure 17 may be implemented by an air curtain using inert gas.

Purge gas made of inert gas is supplied into a space defined by the reticle 6, the reticle stage 7, the reticle surface plate 10, the enclosure 17, and a projection optical system 19 via the gas supply portions 16 formed in the reticle surface plate 10. It is also possible to purge the space by using only inert gas supplied to the hydrostatic bearing 18 without forming the gas supply portions 16.

Ultraviolet rays having passed through the reticle 6 irradiate a wafer 21 on a wafer stage 20 via the projection optical system 19. The projection optical system 19 has a cover 22 serving as an enclosure which extends from the wafer-side lower end of the projection optical system 19 toward the vicinity of the wafer stage 20 and shields the ultraviolet path from the surroundings. Nozzles 23 serving as supply ports for supplying purge gas made of inert gas into the cover 22 are arranged. Inert gas such as nitrogen, helium, or argon is supplied from the projection optical system 19 into the cover 22 via the nozzles 23 to purge an exposure obstacle such as oxygen or moisture. The gap between the lower end of the cover 22 and the wafer 21 is S3.

A top plate 24 is mounted on the wafer stage 20 to be flush with the wafer 21. This prevents the wafer stage 20 from shifting from a portion effectively purged by the cover 22 even if the wafer stage 20 moves by a scan operation.

The impurities inside the cover 22 can be satisfactorily removed. It is more desirable to purge a purge area 25 outside the cover 22 and remove the impurities to a certain degree. In this case, the impurities inside the cover 22 can be removed to a lower concentration. An example of the purge area 25 is a space defined by a projection optical system surface plate 26, wafer stage surface plate 27, and partition 28.

To prevent transmission of vibrations or deformation from the wafer stage surface plate 27 to the projection optical system surface plate 26, the partition 28 is formed from a bellows-like elastic member. Alternatively, it may also be possible to form the partition 28 from a general rigid member instead of the bellows structure, and form a small gap in the whole periphery between the partition 28 and the projection optical system surface plate 26 without coupling the partition 28 to the projection optical system surface plate 26. Since the amount of purge gas increases because purge gas leaks from this gap, no vibrations or deformation transmits. Alternatively, it may also be possible to omit a stage damper 29, form the partition 28 from a general rigid member instead of the bellows structure, and integrally suspend the wafer stage surface plate 27 from the projection optical system surface plate 26 by the partition 28.

In the exposure apparatus of the first embodiment, the impurity in the optical path of a fluorine gas laser light can be purged even with the use of a fluorine gas laser light for exposure light, thereby ensuring a satisfactory transmittance and stability. By connecting an inert gas supply tube to the reticle surface plate 10, the control characteristics of the reticle stage 7 can be improved because no vibrations from the tube transmit to the reticle stage 7.

<Second Embodiment>

Figure 2A:
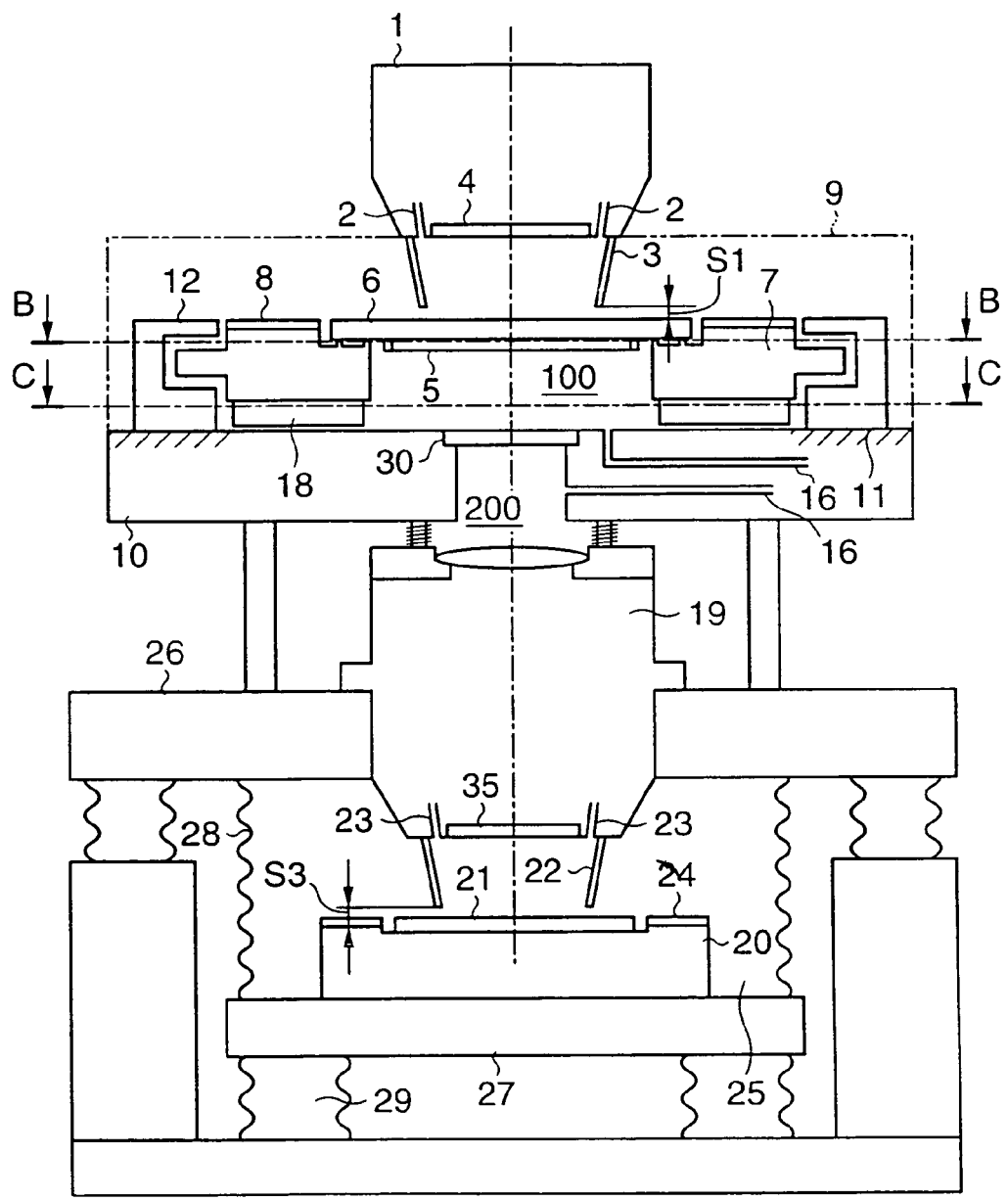
FIG. 2A is a schematic view showing a projection exposure apparatus according to the second embodiment of the present invention.
Figure 2B:
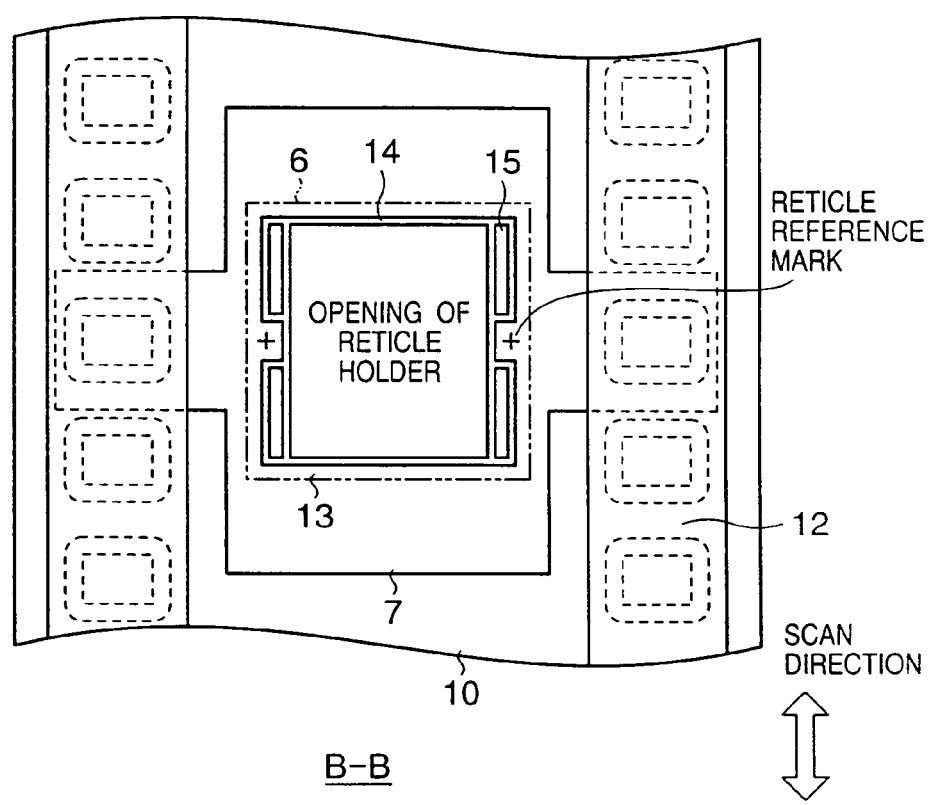
FIG. 2B is a sectional view taken along the line B—B in FIG. 2A.

FIG. 2A shows the main part of a step and scan type projection exposure apparatus according to the second embodiment of the present invention. FIGS. 2B and 2C are sectional views of the exposure apparatus shown in FIG. 2A taken along the lines B—B and C—C, respectively. In the second embodiment, a sheet glass 30 is attached to the opening of a reticle surface plate 10 in place of the enclosure 17 described in the first embodiment. A first space 100 is defined by a reticle 6, a reticle stage 7, the reticle surface plate 10, and the sheet glass 30. A second space 200 is defined by the reticle surface plate 10, the sheet glass 30, and a projection optical system 19. The sheet glass 30 is laid out such that its upper surface (i.e., the surface on the reticle stage 7 side) is flush with the upper surface (i.e., the surface on the reticle stage 7 side) of the reticle surface plate 10. By reducing the step in this manner, the optical path extending from the lower surface of the reticle stage 7 to the projection optical system 19 is hardly disturbed by a scan operation of the reticle stage 7. Accordingly, the concentrations of the impurities which absorb ultraviolet rays stabilize, and spatial and temporal changes in exposure amount further stabilize. The sheet glass 30 may be an optical element for correcting the optical characteristics of exposure light. Conceivable examples of the sheet glass 30 are a spherical lens such as a concave, convex, or cylindrical lens, an aspherical lens, and an optical element whose plane has undergone partial aspherical processing. The sheet glass 30 is preferably so attached as to easily exchange it when contaminants are deposited on the surface. The reticle surface plate 10 has gas supply portions 16 for supplying purge gas made of inert gas into the first and second spaces 100 and 200. The remaining arrangement is the same as that in the first embodiment.

In the exposure apparatus of the second embodiment, the first and second spaces 100 and 200 are purged even if the reticle stage 7 moves by a scan operation since this exposure apparatus does not require any enclosure 17 attached to the reticle stage 7, unlike the first embodiment, the reticle stage 7 can be simplified. Since the sheet glass 30 is set on the reticle surface plate 10 serving as a stationary portion, the reticle stage 7 can be further simplified without any deformation of the sheet glass 30 caused by driving of the stage or any changes in optical characteristics.

<Third Embodiment>

Figure 3A:
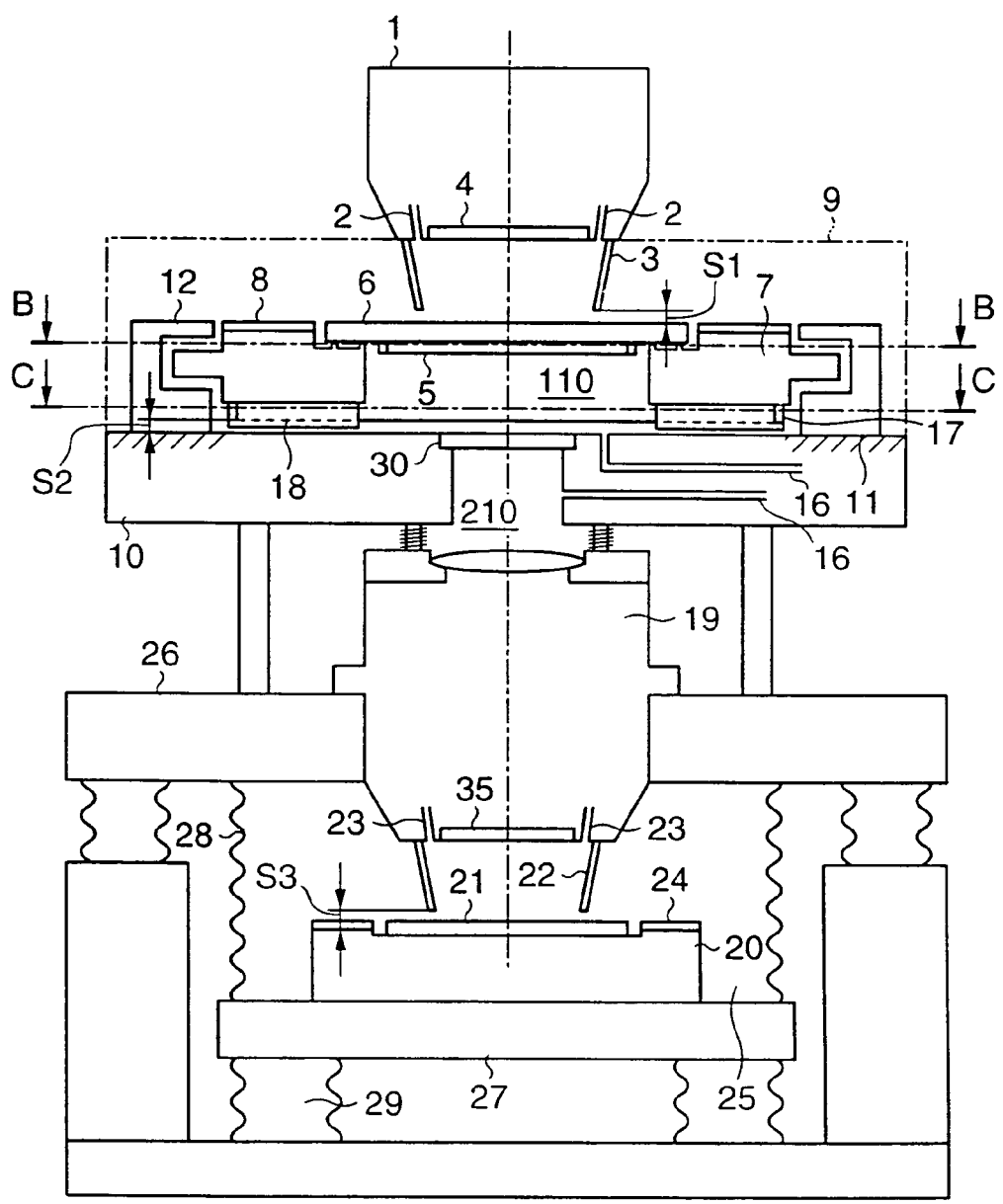
FIG. 3A is a schematic view showing a projection exposure apparatus according to the third embodiment of the present invention.
Figure 3B:
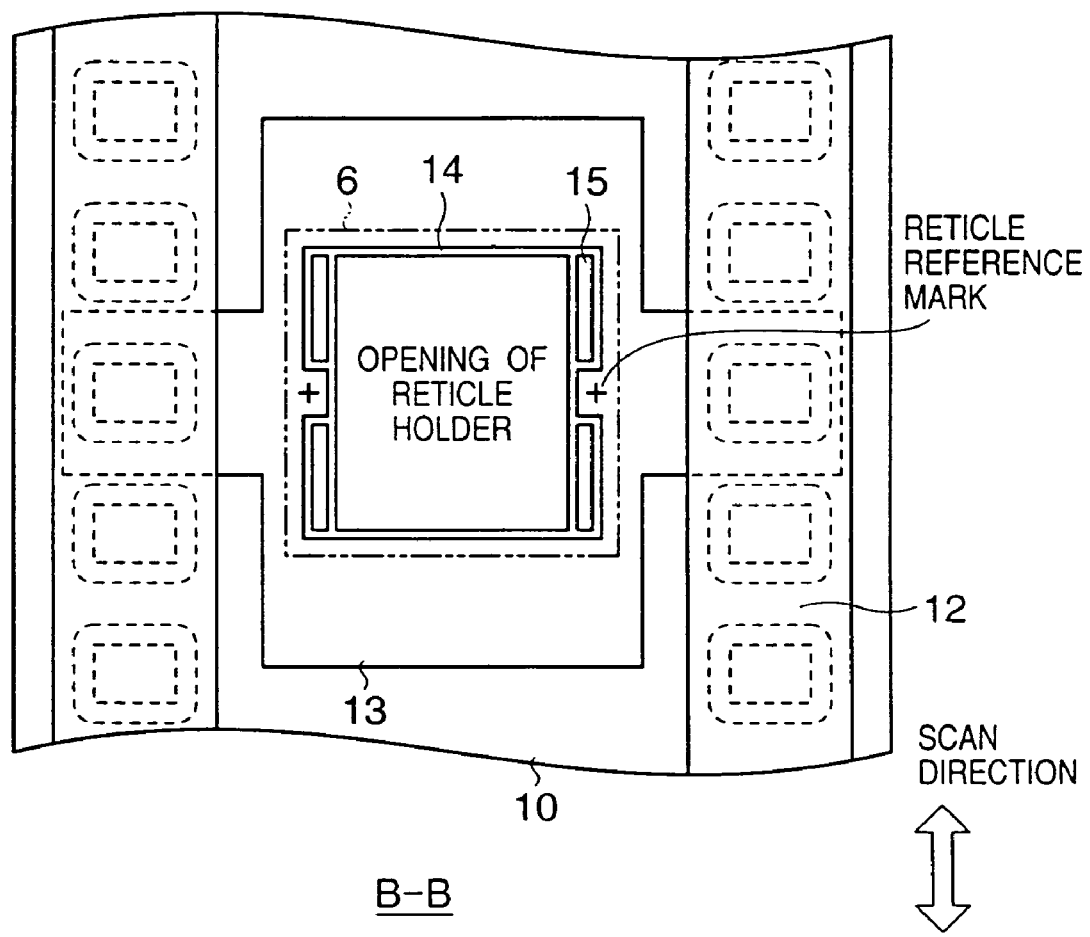
FIG. 3B is a sectional view taken along the line B—B in FIG. 3A.
Figure 3C:
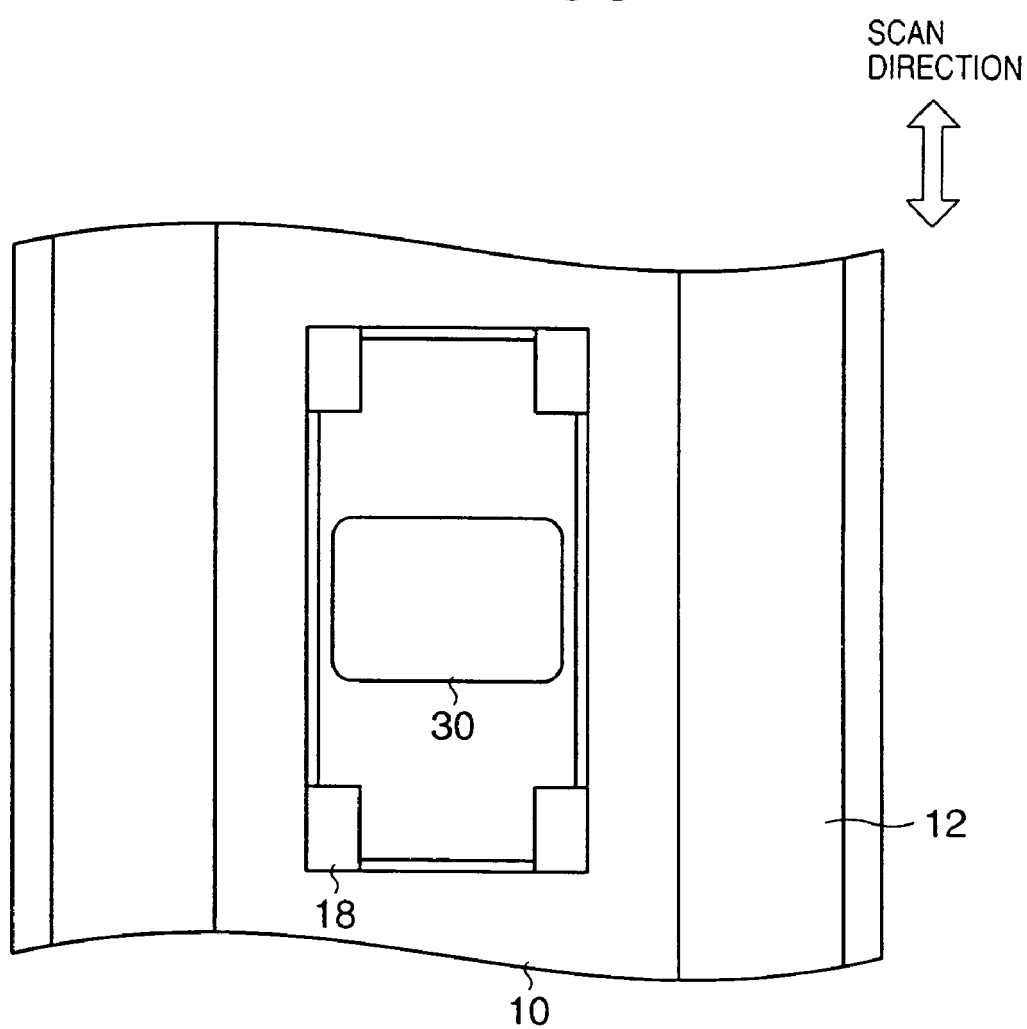
FIG. 3C is a sectional view taken along the line C—C in FIG. 3A.

FIG. 3A shows the main part of a step & scan type projection exposure apparatus according to the third embodiment of the present invention. FIGS. 3B and 3C are sectional views of the exposure apparatus in FIG. 3A taken along the lines B—B and C—C, respectively. The third embodiment adopts both an enclosure 17 as in the first embodiment and a sheet glass 30 as in the second embodiment. A reticle surface plate 10 has gas supply portions 16 for supplying purge gas made of inert gas into a space 110 defined by a reticle 6, a reticle stage 7, a reticle surface plate 10, the enclosure 17, and the sheet glass 30, and a space 210 defined by the reticle surface plate 10, the sheet glass 30, and a projection optical system 19. The remaining arrangement is the same as that in the first embodiment.

In the exposure apparatus of the third embodiment, the purge area between the reticle 6 and the projection optical system 19 is divided. As a result, the concentration distribution of the impurities which absorb a fluorine gas laser beam stabilizes, and spatial and temporal changes in exposure amount become smaller and stable. Since the space in the opening of the reticle stage 7 can hold high airtightness, the concentrations of the impurities which absorb a fluorine gas laser beam are further suppressed to increase the transmittance, and the concentration distribution further stabilizes to reduce and stabilize spatial and temporal changes in exposure amount. Moreover, the consumption amount of purge gas can be reduced, and the purge time until the impurities in the purge area decreases to predetermined concentrations or less can be shortened.

<Fourth Embodiment>

Figure 4:
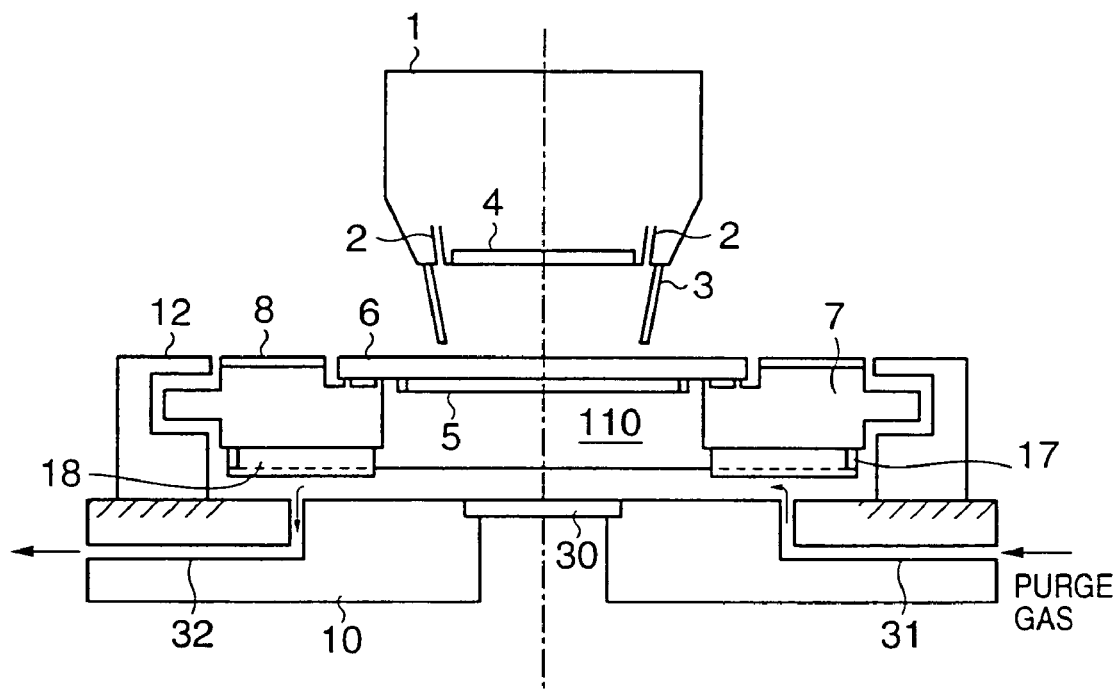
FIG. 4 is a schematic view showing the structure of a projection exposure apparatus around a reticle according to the fourth embodiment of the present invention.

FIG. 4 is a view showing a structure from the illumination optical system to reticle surface plate of an exposure apparatus according to the fourth embodiment. In the fourth embodiment, a supply port 31 for supplying purge gas is formed on one side of a reticle surface plate 10 in the third embodiment, and a recovery port 32 for recovering purge gas is formed on the other side of the reticle surface plate 10, thereby purging a purge area 110 with purge gas. This can also be applied to the first and second embodiments. Purge gas is supplied from the supply port 31 to the vicinity of a reticle in a direction indicated by an arrow. At the same time the purge gas is recovered from a recovery port 32. Exposure light enters a projection optical system via a sheet glass 30. The direction in which purge gas flows may be parallel, perpendicular, or oblique to the scan direction, or may change together with the scan. The purge gas direction is desirably perpendicular to the scan direction so as not to generate any exposure difference in the scan direction.

In the exposure apparatus of the fourth embodiment, the impurities in the optical path of a fluorine gas laser can be purged even with the use of a fluorine gas laser for exposure light, thereby ensuring a satisfactory transmittance and stability of exposure light. In addition, the supply and recovery ports are formed to positively generate the flow of purge gas from the supply port to the recovery port. This can prevent contamination in the purge area owing to residence of the purge gas in the purge area.

<Fifth Embodiment>

FIG. 5 is a flow chart in a case wherein inert gas flows only when a wafer and/or reticle is loaded below a cover 3 and/or cover 22 in order to save the amount of inert gas in the first to fourth embodiments. Similarly, the presence/absence of top plates 8 and 24 is also considered, and inert gas is saved by flowing inert gas only when a top plate is loaded.

<Sixth Embodiment>

The sixth embodiment employs pressure sensors within covers 3 and 22 in the exposure apparatuses of the first to fifth embodiments, and adopts a purge gas supply unit having a function of controlling the gas pressure in a purged space. The purge gas pressure in the space is controlled to a constant value regardless of the space on the basis of pressure values measured by the pressure sensors.

The effects unique to this arrangement will be explained. The interior of the lens barrel of an illumination optical system 1 or projection optical system 19 is also purged to an almost sealed system with inert gas in order to remove the impurity. The interior of the lens barrel maintains an almost constant pressure without following external pressure variations. For this reason, a pressure difference is generated between the inside and outside of the lens barrel in accordance with the pressure variations outside the lens barrel. Then, an optical element below the illumination optical system 1 or projection optical system 19 deforms in accordance with the pressure difference, and the optical performance changes in accordance with the pressure variations. However, by controlling the purge gas pressures inside the covers 3 and 22 below these optical elements to constant values, the sixth embodiment can prevent generation of any pressure difference and can suppress changes in optical performance caused by the pressure variations.

Figure 6A:
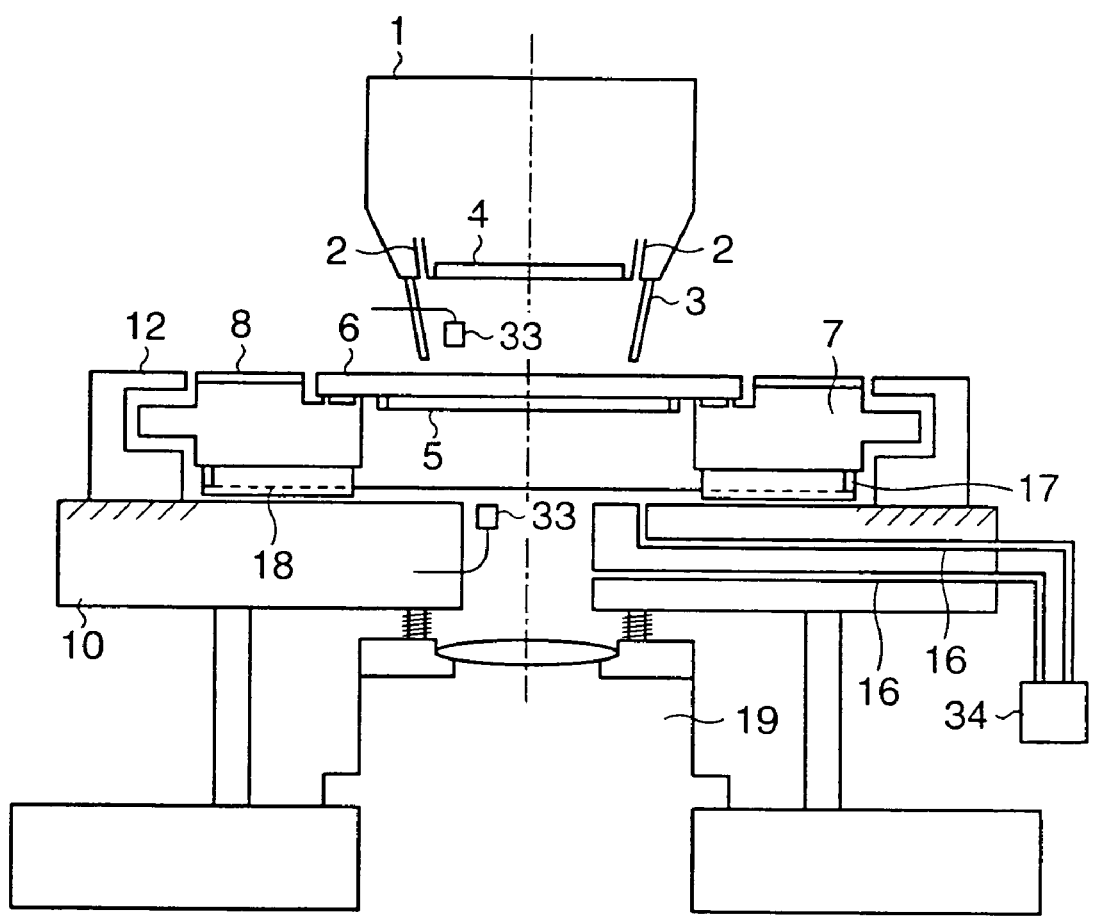
FIG. 6A is a schematic view showing a structure of a projection exposure apparatus around a reticle according to the sixth embodiment of the present invention.

FIG. 6A shows an embodiment in which pressure sensors 33 are arranged inside the cover 3 and inside the reticle stage 7 or the opening of the reticle surface plate 10 in the first embodiment, and a purge gas supply unit 34 having a function of controlling the purge gas pressure is disposed upstream of the gas supply portion 16. The purge gas supply unit 34 controls the purge gas pressure on the basis of pressure values measured by the pressure sensors 33, and thus controls purge gas pressures inside the covers 3 and 22 regardless of the external pressure.

Figure 6B:
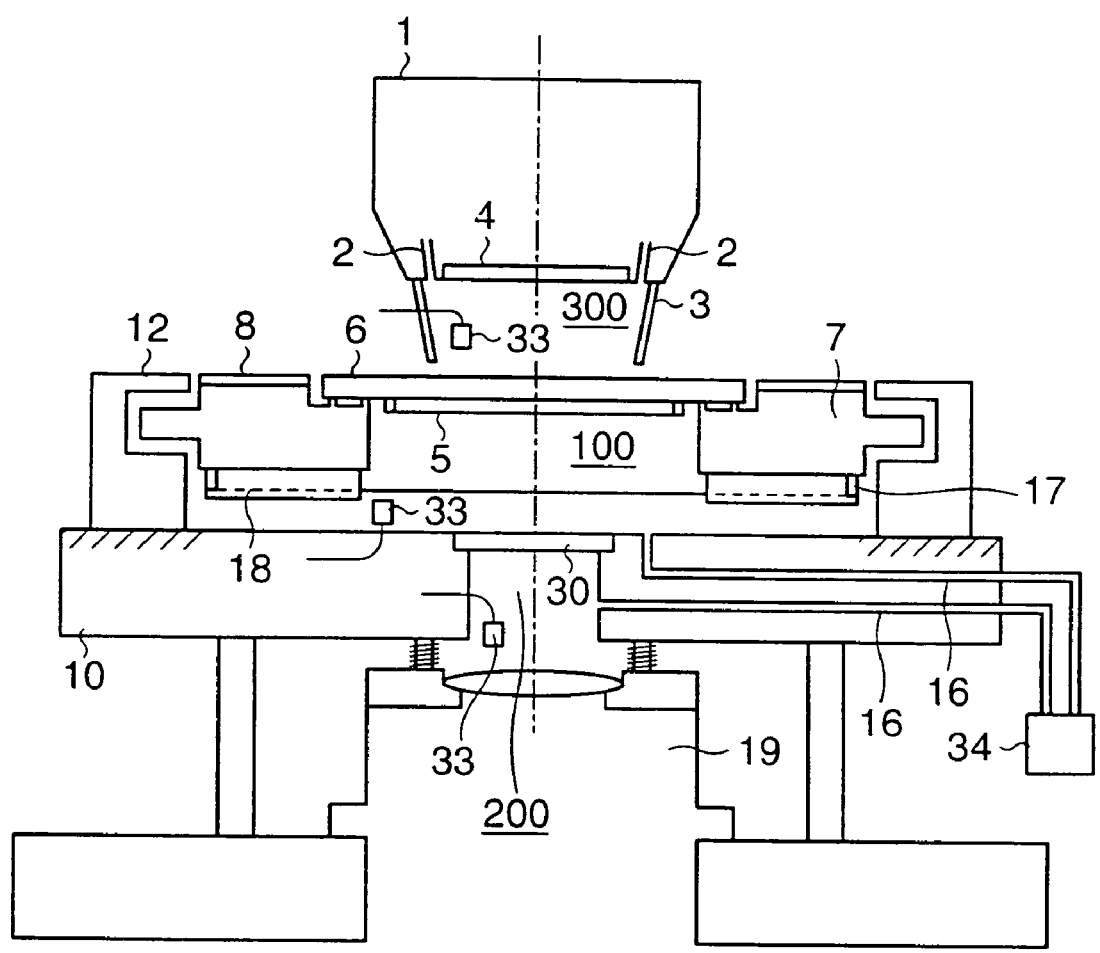
FIG. 6B is a schematic view showing another structure of the projection exposure apparatus around the reticle according to the sixth embodiment of the present invention.

FIG. 6B shows an embodiment in which pressure sensors 33 are arranged at three portions, i.e., inside the cover 3, inside the reticle stage 7, and above the projection optical system 19 in the third embodiment, and a purge gas supply unit 34 having a function of controlling the purge gas pressure is adopted. When a sheet glass 30 is attached to the reticle surface plate 10, like this embodiment, purge gas pressures in a space 100 inside the reticle stage 7 and a space 200 above the projection optical system 19 are controlled to constant values. No pressure difference is generated between the spaces 100 and 200, the sheet glass 30 does not deform, and changes in optical performance can be suppressed. Furthermore, purge gas pressures in a space 300 and the space 100 above and below the reticle 6 also keep constant without generating any pressure difference between them, and the reticle 6 does not deform.

If the flexure of the reticle 6 by its weight or its flatness causes defocus or distortion, the purge gas pressure in the internal space of the reticle stage 7 defined by the reticle 6, the reticle stage 7, an enclosure 17, the reticle surface plate 10, and the sheet glass 30 is controlled to an optimal known value, thereby deforming the reticle 6 or sheet glass 30 by a predetermined amount. As a result, defocus or distortion can be reduced. The optimal pressure is a pressure which minimizes defocus and distortion checked by performing exposure using a desired reticle 6 in advance while changing the purge gas pressure. Alternatively, the optimal pressure may be obtained by simulation calculation.

<Seventh Embodiment>

In the first to sixth embodiments, purge gas made of inert gas such as nitrogen, helium, or argon is supplied through each nozzle. An exposure apparatus according to the seventh embodiment also comprises a mechanism of mixing cleaning gas such as oxygen ($O_2$) and/or ozone ($O_3$) in the inert gas.

Figure 12:
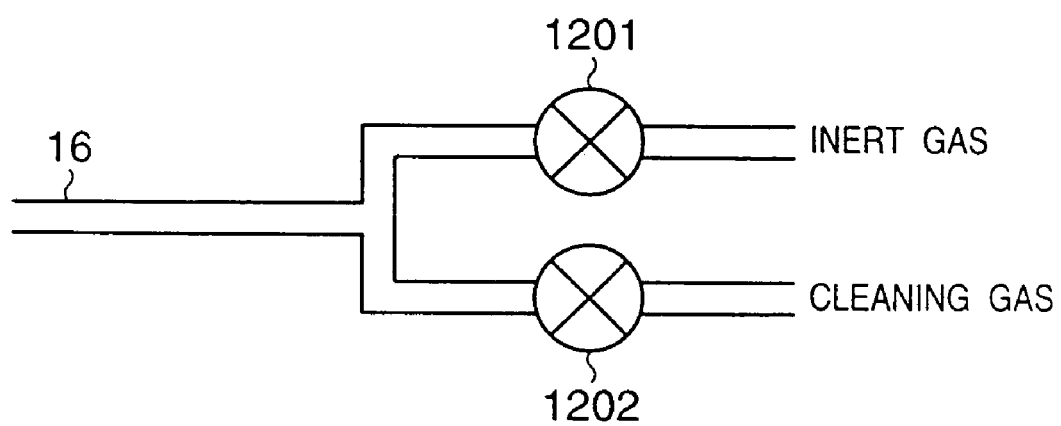
FIG. 12 is a view schematically showing a mechanism of mixing cleaning gas in inert gas.

A detailed arrangement will be described with reference to FIG. 12. In normal exposure, a valve 1202 is closed to prevent mixing of oxygen and/or ozone, and a valve 1201 is opened to supply only inert gas into an optical path, i.e., a purge area through a gas supply portion 16. In a standby state in which the exposure apparatus is inactive, during normal exposure at a designated time interval, or in a case wherein a reticle is set on the reticle stage, the valve 1202 is opened to mix a small amount of oxygen and/or ozone in the inert gas and to purge the purge area. Without loading any wafer, a dummy exposure operation is done for a predetermined time or until a prescribed illuminance at the image plane is attained. After that, mixing of oxygen and/or ozone is stopped. Only inert gas is supplied for purge, and a normal exposure operation is executed.

The effects unique to this arrangement will be explained. Short-wavelength exposure light such as far ultraviolet rays, particularly, an ArF excimer laser beam or fluorine excimer laser beam decomposes an impurity such as organic molecules in the air. The decomposition product is deposited on an optical element. The surface of the optical element bears a carbon film, a carbon-containing film, or a deposit of the organic compound. The transmittance of the optical element gradually decreases to decrease the illuminance at the image plane, resulting in low throughput. In the above embodiments, the vicinity in low throughput. In the above embodiments, the vicinity of the reticle 6 or wafer 21 is purged with inert gas to minimize the impurity concentration, but a small amount of impurities may remain. For example, degassing may occur from a resist applied to the wafer 21 or an adhesive layer between the resist and the wafer 21 during or before exposure, and an impurity may exist near a sheet glass 35 below the projection optical system 19. Also, the reticle 6 with a small amount of impurities may be loaded and part of the impurities may evaporate, or degassing may occur from an adhesive layer between the reticle 6 and a pellicle frame or an adhesive layer between the pellicle frame and a pellicle 5, and the impurities may exist near a sheet glass 4 below the illumination optical system 1, the sheet glass 30 of the reticle surface plate 10, or the surface of an optical element above the projection optical system 19. In these cases, the organic compound decomposed and produced by exposure is deposited on optical elements, and the transmittance gradually decreases. To prevent this, these optical elements are illuminated with exposure light during purge while a small amount of ozone is mixed in inert gas. The deposited organic compound is oxidized and decomposed by a so-called ozone cleaning effect, and deposition of the decomposition product is prevented. Alternatively, the optical elements are illuminated with exposure light during purge while a small amount of oxygen is mixed in the inert gas. Then, oxygen is converted into ozone by a photochemical reaction, obtaining the same ozone cleaning effect as that of a mixture of ozone. Periodic execution of this processing can prevent a decrease in illuminance at the image plane and can always maintain high throughput.

<Embodiment of Semiconductor Production System>

A production system for a semiconductor device (e.g., a semiconductor chip such as an IC or LSI, a liquid crystal panel, CCD, a thin-film magnetic head, a micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 7:
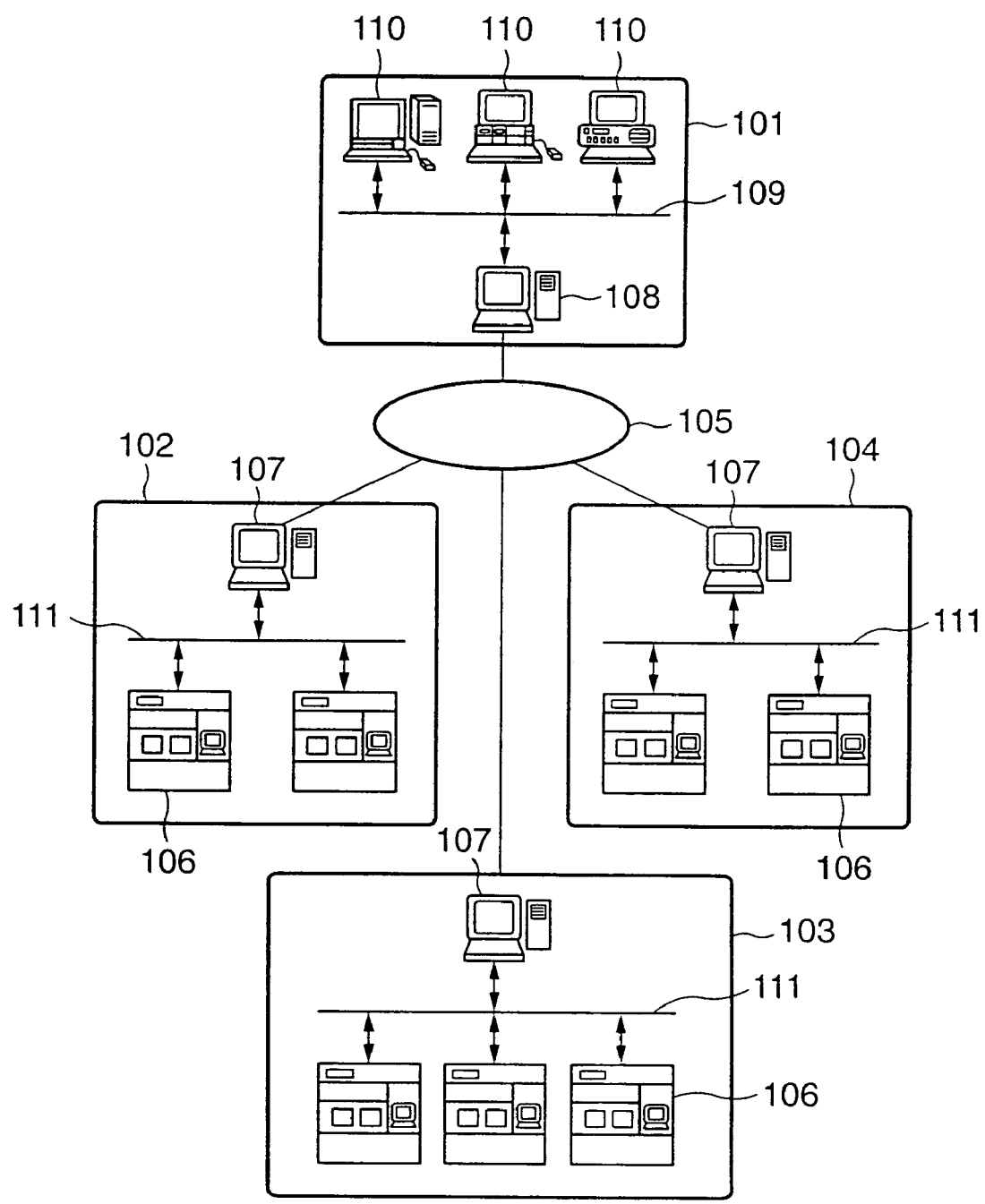
FIG. 7 is a view showing a semiconductor device production system according to the present invention when viewed from a given angle.

FIG. 7 shows the overall system cut out at a given angle. In FIG. 7, reference numeral 101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, an inspection apparatus, and the like). The business office 101 comprises a host management system 108 for providing a maintenance database for the manufacturing apparatus, a plurality of operation terminal computers 110, and a LAN (Local Area Network) 109 which connects the host management system 108 and computers 110 to construct an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111 which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106. The factory can receive, from the vendor, response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factories.

Figure 8:
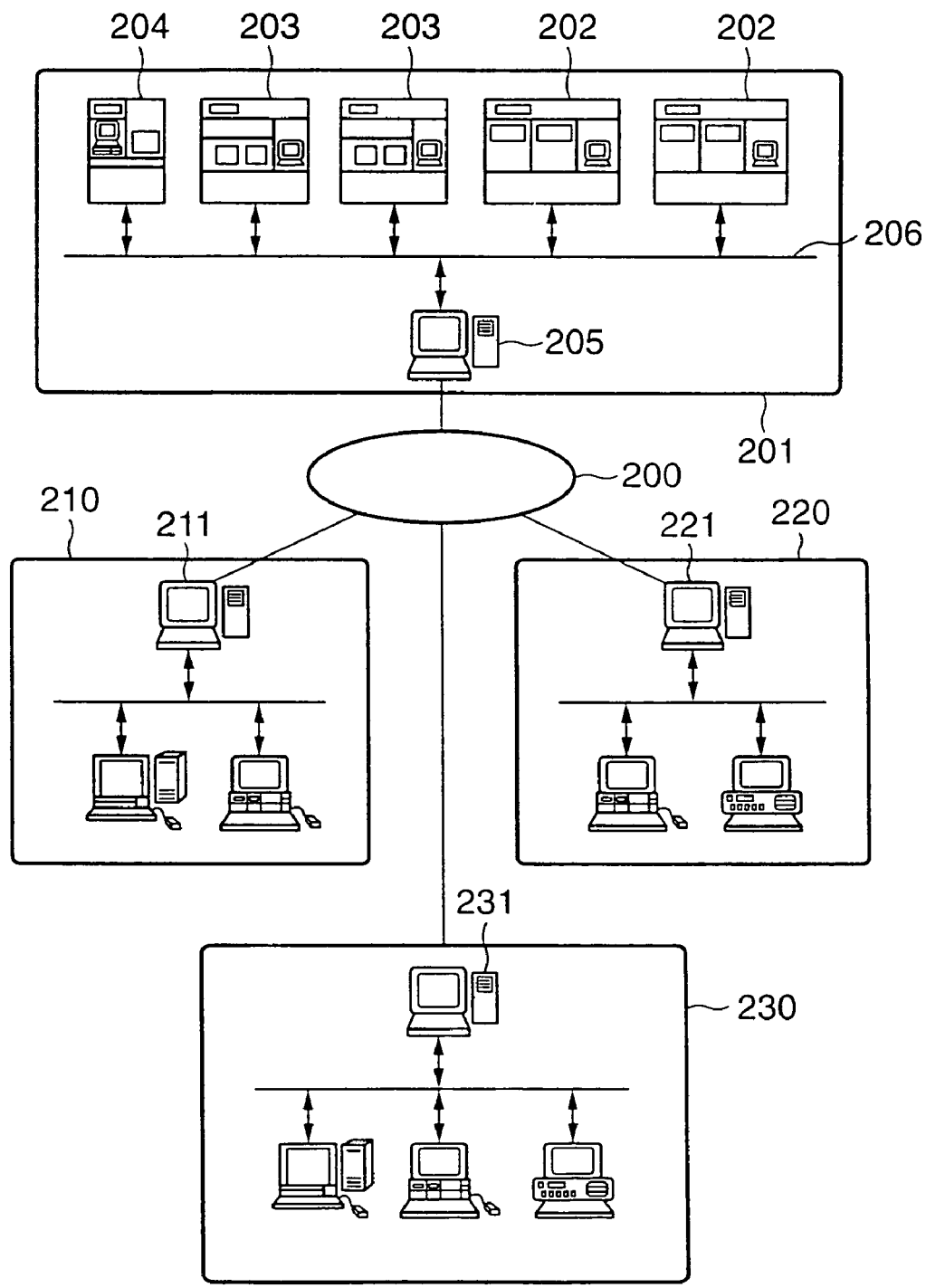
FIG. 8 is a view showing the semiconductor device production system according to the present invention when viewed from another angle.

FIG. 8 is a view showing the concept of the overall system of this embodiment that is cut out at a different angle from FIG. 7. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 8, a factory having manufacturing apparatuses of a plurality of vendors, and the management systems of the vendors for these manufacturing apparatuses are connected via the external network of the factory, and maintenance information of each manufacturing apparatus is communicated. In FIG. 8, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 8 shows only one manufacturing factory 201, but a plurality of factories are networked in practice. The respective apparatuses in the factory are connected to a LAN 206 to construct an intranet, and a host management system 205 manages the operation of the manufacturing line. The business offices of vendors (apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated-line network serving as an external network 200. If a trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stop of the manufacturing line.

Figure 9:
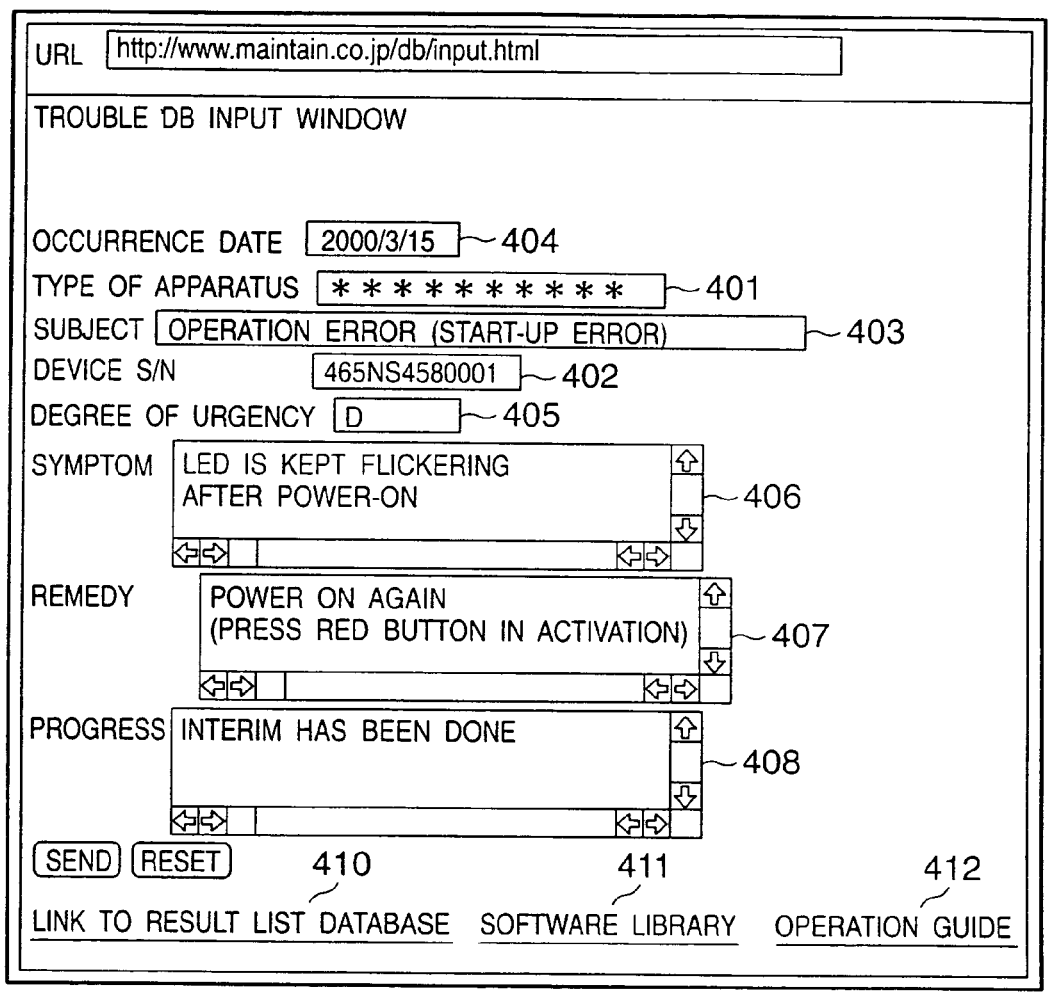
FIG. 9 is a view showing an example of a user interface in the exposure apparatus of the present invention.

Each of the manufacturing apparatuses in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 9 on the display. While referring to this window, the operator who manages manufacturing apparatuses in each factory inputs, in input items on the windows, pieces of information such as the type of manufacturing apparatus (401), serial number (402), subject of trouble (403), occurrence data (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 9. This allows the operator in the factory to access detailed information of each item, receive the latest-version software to be used for a manufacturing apparatus from a software library provided by a vendor, and receive an operation guide (help information) as a reference for the operator in the factory. The maintenance information provided by the maintenance database also includes information about the features of the present invention described above. The software library also provides the latest-version software for implementing the features of the present invention.

Figure 10:
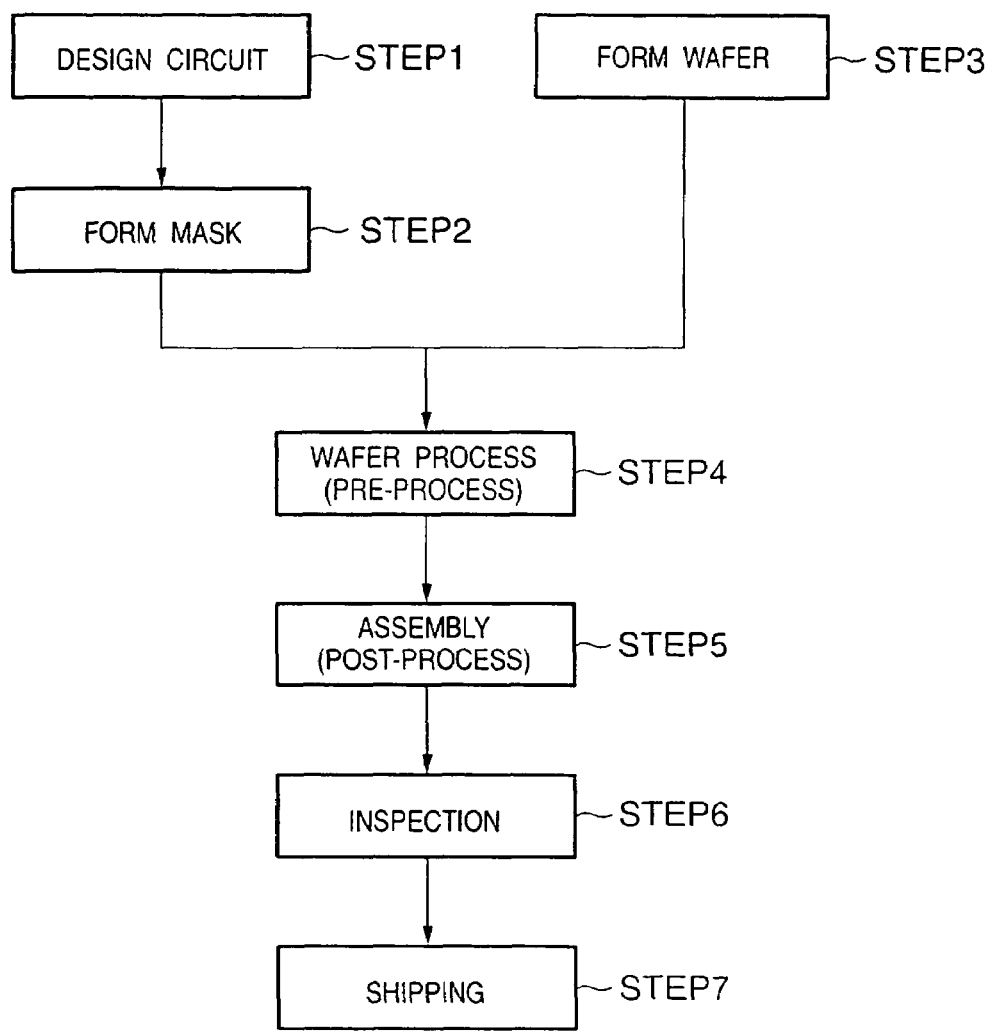
FIG. 10 is a flow chart showing a semiconductor device manufacturing process.

A semiconductor device manufacturing process using the above-described production system will be explained. FIG. 10 shows the flow of the whole manufacturing process of the semiconductor device. In step 1 (circuit design), a semiconductor device circuit is designed. In step 2 (mask formation), a mask having a designed circuit pattern is formed. In step 3 (wafer manufacture), a wafer is manufactured using a material such as silicon. In step 4 (wafer process) called a pre-process, an actual circuit is formed on the wafer by lithography using the prepared mask and wafer. Step 5 (assembly) called a post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated-line network.

Figure 11:
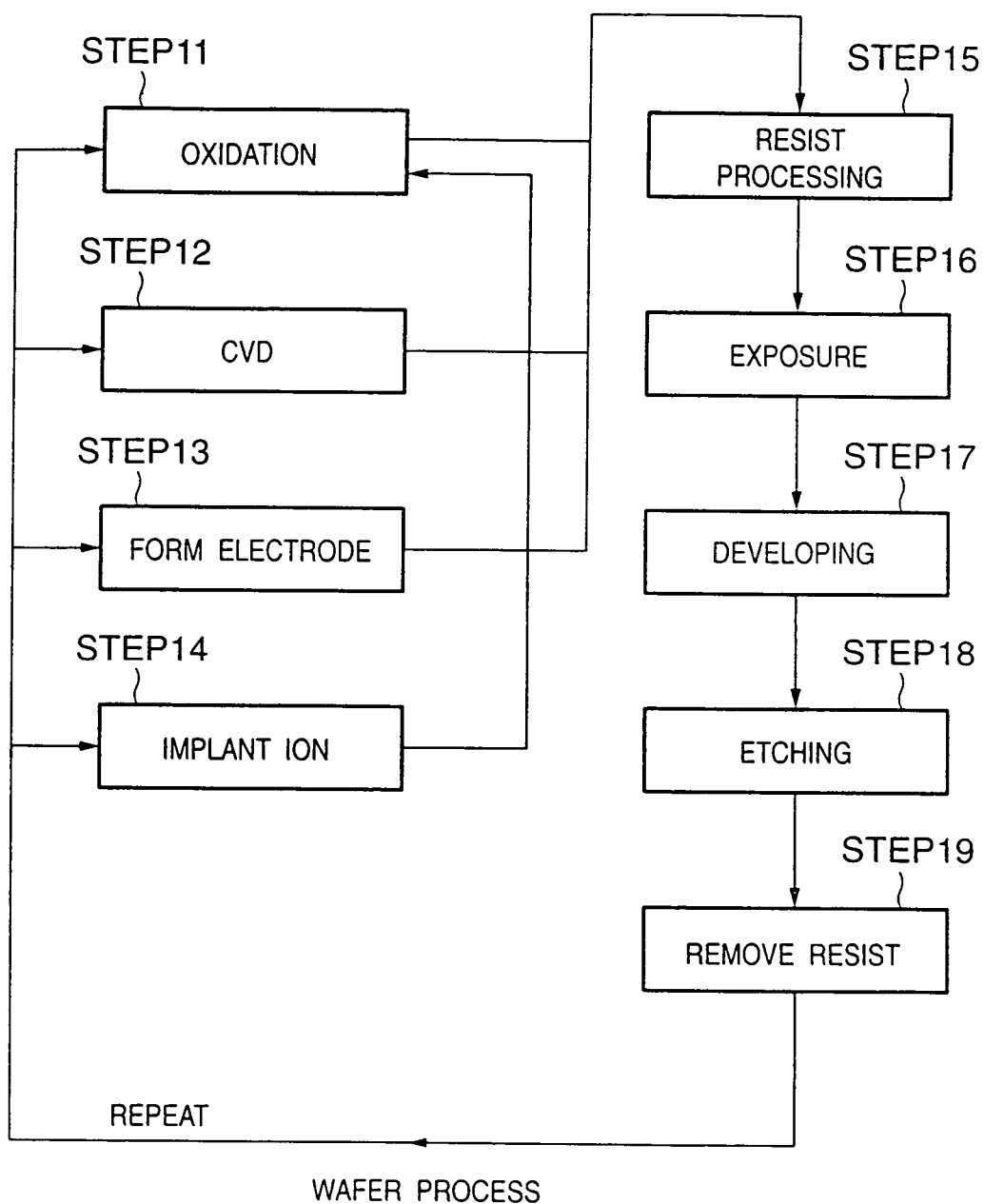
FIG. 11 is a flow chart showing a wafer process (step 4) in detail.

FIG. 11 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of the mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, according to the present invention, oxygen and moisture can be partially, effectively purged near a reticle and/or wafer in an exposure apparatus using ultraviolet rays, particularly, an ArF excimer laser beam or a fluorine ($F_2$) excimer laser beam can be obtained. This realizes high-precision projection exposure and satisfactory projection of a fine circuit pattern.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to light via a pattern of a reticle, said apparatus comprising:
    a reticle stage configured to hold the reticle and to move;
    a projection optical system configured to project the pattern onto the substrate;
    a base plate disposed between said reticle stage and said projection optical system, configured to support said reticle stage and having an opening for the light to pass;
    a sheet glass held by said base plate, disposed at the opening and configured to transmit the light; and
    a supply system configured to supply an inert gas to a space partitioned by said projection optical system, said base plate and said sheet glass, said supply system having a port which faces toward a direction substantially perpendicular to an optical axis of said projection optical system, the inert gas being supplied from said port.

2. A method of manufacturing a device, said method comprising steps of:
    exposing a substrate to light via a pattern of a reticle using an exposure apparatus as defined in claim 1;
    developing the exposed substrate; and
    processing the developed substrate to manufacture the device.

3. An exposure apparatus for exposing a substrate to light via a pattern of a reticle, said apparatus comprising:
    a reticle stage configured to hold the reticle and to move;

a projection optical system configured to project the pattern onto the substrate;

a base plate disposed between said reticle stage and said projection optical system, configured to support said reticle stage and having an opening for the light to pass;

a sheet glass held by said base plate, disposed at the opening and configured to transmit the light; and a supply system configured to supply an inert gas to a space partitioned by said projection optical system, said base plate, and said sheet glass, said supply system having a port in said base plate, the inert gas being supplied from said port.

4. A method of manufacturing a device, said method comprising steps of:

exposing a substrate to light via a pattern of a reticle using an exposure apparatus as defined in claim 3;

developing the exposed substrate; and processing the developed substrate to manufacture the device.

5. An exposure apparatus for exposing a substrate to light via a pattern of a reticle, said apparatus comprising:

a reticle stage configured to hold the reticle and to move;

a projection optical system configured to project the pattern onto the substrate;

a base plate disposed between said reticle stage and said projection optical system, configured to support said reticle stage and having an opening for the light to pass;

a sheet glass held by said base plate, disposed at the opening so that an upper surface of said sheet glass is even with an upper surface of said base plate, and configured to transmit the light; and a supply system configured to supply an inert gas to a space partitioned by said projection optical system, said base plate, and said sheet glass, said supply system having a port disposed at a height between the upper surface of said base plate and a lower surface of said base plate, the inert gas supplied from said port.

6. A method of manufacturing a device, said method comprising steps of:

exposing a substrate to light via a pattern of a reticle using an exposure apparatus as defined in claim 5;

developing the exposed substrate; and processing the developed substrate to manufacture the device.

* * * * *

UNITED STATES PATENT AND TRADEMARK OFFICE
CERTIFICATE OF CORRECTION

PATENT NO. : 7,034,918 B2 Page 1 of 1
APPLICATION NO. : 11/083936
DATED : April 25, 2006
INVENTOR(S) : Kiyoshi Arakawa It is certified that error appears in the above-identified patent and that said Letters Patent is hereby corrected as shown below:

COLUMN 9:
Line 8, "decreases" should read -- decreased --.

COLUMN 11:
Line 11, "the vicinity in low throughput. In the above embodi-" should be deleted.
Line 12, "ments," should be deleted.

COLUMN 13:
Line 13, the first occurrence of "a" should be deleted.

Signed and Sealed this

Twenty-first Day of November, 2006

JON W. DUDAS
*Director of the United States Patent and Trademark Office*